(12) United States Patent
Yoshie

(10) Patent No.: US 7,224,064 B2
(45) Date of Patent: May 29, 2007

(54) SEMICONDUCTOR DEVICE HAVING CONDUCTIVE INTERCONNECTIONS AND POROUS AND NONPOROUS INSULATING PORTIONS

(75) Inventor: Toru Yoshie, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 85 days.

(21) Appl. No.: 11/042,033

(22) Filed: Jan. 24, 2005

(65) Prior Publication Data
US 2005/0133923 A1    Jun. 23, 2005

Related U.S. Application Data

(62) Division of application No. 09/956,461, filed on Sep. 20, 2001, now Pat. No. 6,916,724.

(30) Foreign Application Priority Data
Feb. 2, 2001   (JP) ............................ 2001-026879

(51) Int. Cl.
*H01L 23/52* (2006.01)
*H01L 23/532* (2006.01)
*H01L 29/40* (2006.01)
*B24B 37/04* (2006.01)
*B24B 57/02* (2006.01)

(52) U.S. Cl. .............................. 257/758; 257/E23.144; 257/E23.167; 257/E23.245; 257/774; 257/700; 257/701; 257/522; 257/552; 257/618; 257/759; 257/760

(58) Field of Classification Search ........ 257/758–760, 257/762, 774–776, E23.144, E23.145, E23.167, 257/E23.262, E21.581, E23.16, E23.577, 257/E21.579, 552, 700, 701, 741, 750, 618
See application file for complete search history.

(56) References Cited

U.S. PATENT DOCUMENTS 5,449,427 A    9/1995    Wojnarowski et al. ...... 156/155

(Continued)

FOREIGN PATENT DOCUMENTS

| JP | 8-64679 | 3/1996 |
| JP | 08-125020 | 5/1996 |
| JP | 11-017007 | 1/1999 |
| JP | 11008300 | 1/1999 |
| JP | 2000216153 | 8/2000 |

OTHER PUBLICATIONS

Jin, Changming, Wetzel, Jeff; Characterization and Integration of Porous Extra Low-k (XLK) Dielectrics; Jun. 5-7, 2000; Proceedings of the IEEE Interconnect Technology Conference, 2000; p. 99.*

*Primary Examiner*—Alexander Oscar Williams
(74) *Attorney, Agent, or Firm*—Volentine & Whitt, P.L.L.C.

(57) ABSTRACT

A semiconductor device and manufacturing method, wherein the semiconductor device has a semiconductor substrate on which a plurality of elements constituting a logic type device have been formed; a first interlayer insulating film on the semiconductor substrate; a plurality of groove patterns provided in the first interlayer insulating film; lower interconnections formed by embedding electroconductive films, which are composed of an electroconductive material such as copper, in the groove patterns; and first porous portions that are selectively provided in the portions of the first interlayer insulating film having the lower interconnections formed therein, the portions being in contact with the lower interconnections. A semiconductor device having an interlayer insulating film that exhibits satisfactory mechanical strengths, thermal conductivity and low dielectric constant is thus provided.

10 Claims, 6 Drawing Sheets

U.S. PATENT DOCUMENTS

| | | |
|---|---|---|
| 5,527,737 A | 6/1996 | Jeng |
| 5,785,787 A | 7/1998 | Wojnarowski et al. ...... 156/155 |
| 5,858,871 A | 1/1999 | Jeng |
| 5,864,172 A | 1/1999 | Kapoor et al. .............. 257/634 |
| 6,143,646 A | 11/2000 | Wetzel |
| 6,163,066 A | 12/2000 | Forbes et al. ............... 257/632 |
| 6,387,824 B1 | 5/2002 | Aoi ........................... 438/778 |
| 6,602,802 B2 | 8/2003 | Aoi |
| 6,657,302 B1* | 12/2003 | Shao et al. .................. 257/758 |
| 6,867,125 B2* | 3/2005 | Kloster et al. ............. 438/618 |
| 6,873,052 B2 | 3/2005 | Aoi |
| 2002/0005584 A1* | 1/2002 | Domae ........................ 257/758 |
| 2002/0076935 A1* | 6/2002 | Maex et al. ................. 438/706 |
| 2004/0063305 A1* | 4/2004 | Kloster et al. ............. 438/619 |
| 2005/0133920 A1* | 6/2005 | Liou et al. .................. 257/758 |

* cited by examiner

SEMICONDUCTOR DEVICE HAVING CONDUCTIVE INTERCONNECTIONS AND POROUS AND NONPOROUS INSULATING PORTIONS

CROSS-REFERENCE TO RELATED APPLICATIONS

The present application is a divisional application under 35 U.S.C. § 121 of U.S. patent application Ser. No. 09/956,461 filed 09/20/01 now U.S. Pat. No. 6,916,724. A claim of priority is made to the referenced application, and the disclosure of the referenced application is hereby incorporated herein by reference.

BACKGROUND OF THE INVENTION

1. Field of the Invention

The present invention relates to a semiconductor device and a manufacturing method therefor and, more particularly, to a technology effectively applied to a conductive pattern formed by an electroconductive material in a groove formed in an insulating film.

2. Description of Related Art

With the recent trend toward higher integration and further microminiaturization, there has been demand for multilayer wiring structures and micro-wiring or the like. In addition, there has been growing need for lower resistance of a conductive pattern material in response to the demand for lower power consumption and higher speed in semiconductor devices.

To meet such needs, heretofore, a groove pattern is formed in an interlayer insulating film formed on the surface of a substrate, and an electroconductive material, such as copper (Cu), is embedded. Thereafter, unwanted electroconductive material at the top of the groove is removed by the chemical mechanical polishing (CMP) process thereby to complete the wiring. This technology is known as "damascene process".

A conventional semiconductor device having a multilayer wiring structure has been implemented, in which a upper interconnection and a third conductive pattern that are formed by the damascene process are deposited on a lower interconnection formed also by the damascene process.

The demand for higher integration in semiconductor devices in recent years, however, has been accelerating, leading to the increasing demand for enhanced multilayer wiring and further reduced wiring width.

In serving the aforesaid need, the conventional semiconductor devices have been incurring an increased capacitance between conductive patterns attributable to reduced wiring pitches, and slower operating speed of semiconductor elements due to the increased capacitance between conductive patterns, thus posing a serious problem. In other words, it is becoming difficult for the aforesaid semiconductor device having the conventional multilayer wiring structure to fully realize required higher speed.

Hence, in recent years, an attempt has been made to use an insulating film with a lower dielectric constant (relative dielectric constant $\in$=below 2.5) for the interlayer insulating film between conductive patterns in a semiconductor device employing the Damascene process. Such an insulating film may be, for example, an insulating film with low dielectric constant to which an organic material or the like has been added.

However, using such an insulating film with low dielectric constant as the interlayer insulating film has been posing a new problem, although it is able to provide lower relative dielectric constant. More specifically, the insulating film with low dielectric constant is much coarser than a conventionally used silicon oxide film, so that it cannot provide satisfactory mechanical strength and thermal conductivity required of an interlayer insulating film for a semiconductor device having the multilayer wiring structure.

SUMMARY OF THE INVENTION

Accordingly, an object of the present invention is to provide a semiconductor device that realizes still higher integration and higher speed by providing an interlayer insulating film having sufficiently high mechanical strength and thermal conductivity in a semiconductor device that uses an interlayer insulating film composed of an insulating material with a low dielectric constant, and a manufacturing method for the same.

To this end, a representative semiconductor device in accordance with the present invention has a plurality of grooves formed in a first insulating film on a substrate, a plurality of lower interconnections embedded in the grooves, first porous portions provided in contact with a plurality of the lower interconnections in the first insulating film containing a plurality of the lower interconnections, and first nonporous portions provided among the first porous portions.

A representative manufacturing method for a semiconductor device in accordance with the present invention includes forming a first insulating film on the surface of a substrate and providing grooves in the first insulating film, embedding electroconductive materials in the grooves to form the lower interconnections, and providing first porous portions on a portion of the first insulating film that is in contact with the lower interconnections after providing the grooves.

With this arrangements, according to the present invention, the porous portions having low dielectric constants are provided selectively on the portions in contact with the side surfaces and the bottom surfaces of the conductive patterns formed in the grooves provided in the insulating film on a substrate. This makes it possible to provide an interlayer insulating film that reduces the inter-connection capacitance caused by a plurality of conductive patterns and has sufficiently high mechanical strength and thermal conductivity.

BRIEF DESCRIPTION OF THE DRAWINGS

While the specification concludes with claims particularly pointing out and distinctly claiming the subject matter which is regarded as the invention, it is believed that the invention, the objects, features and advantages thereof will be better understood from the following description taken in connection with the accompanying drawings in which:

DETAILED DESCRIPTION OF THE PREFERRED EMBODIMENTS

A first embodiment in accordance with the present invention will now be described with reference to the accompanying drawings.

Figure 1:
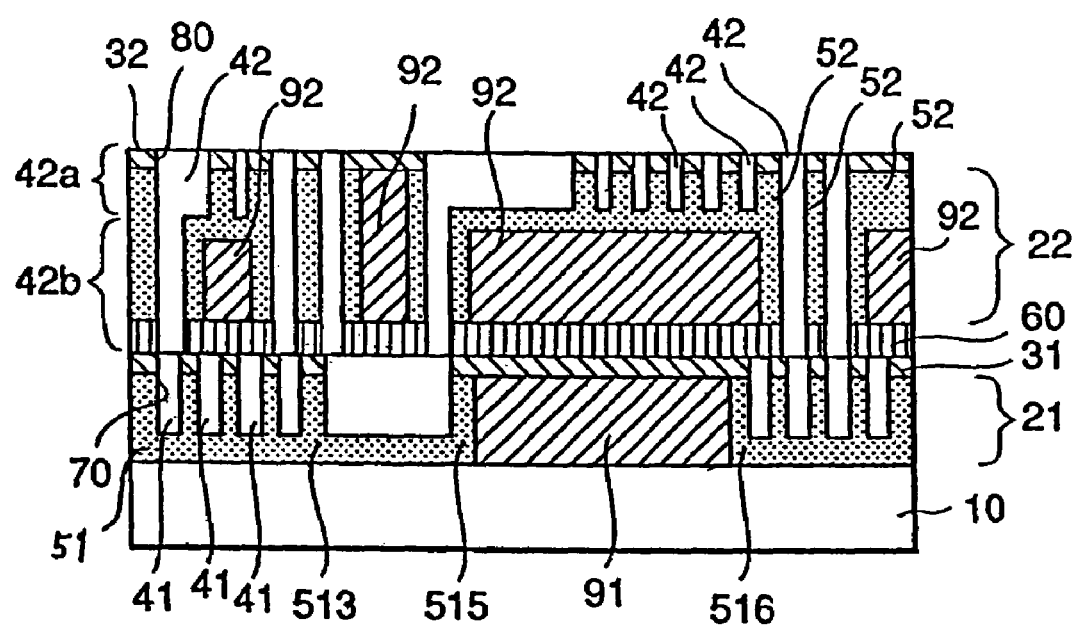
FIG. 1 is a cross-sectional view of a semiconductor device showing a first embodiment in accordance with the present invention.
Figure 2:
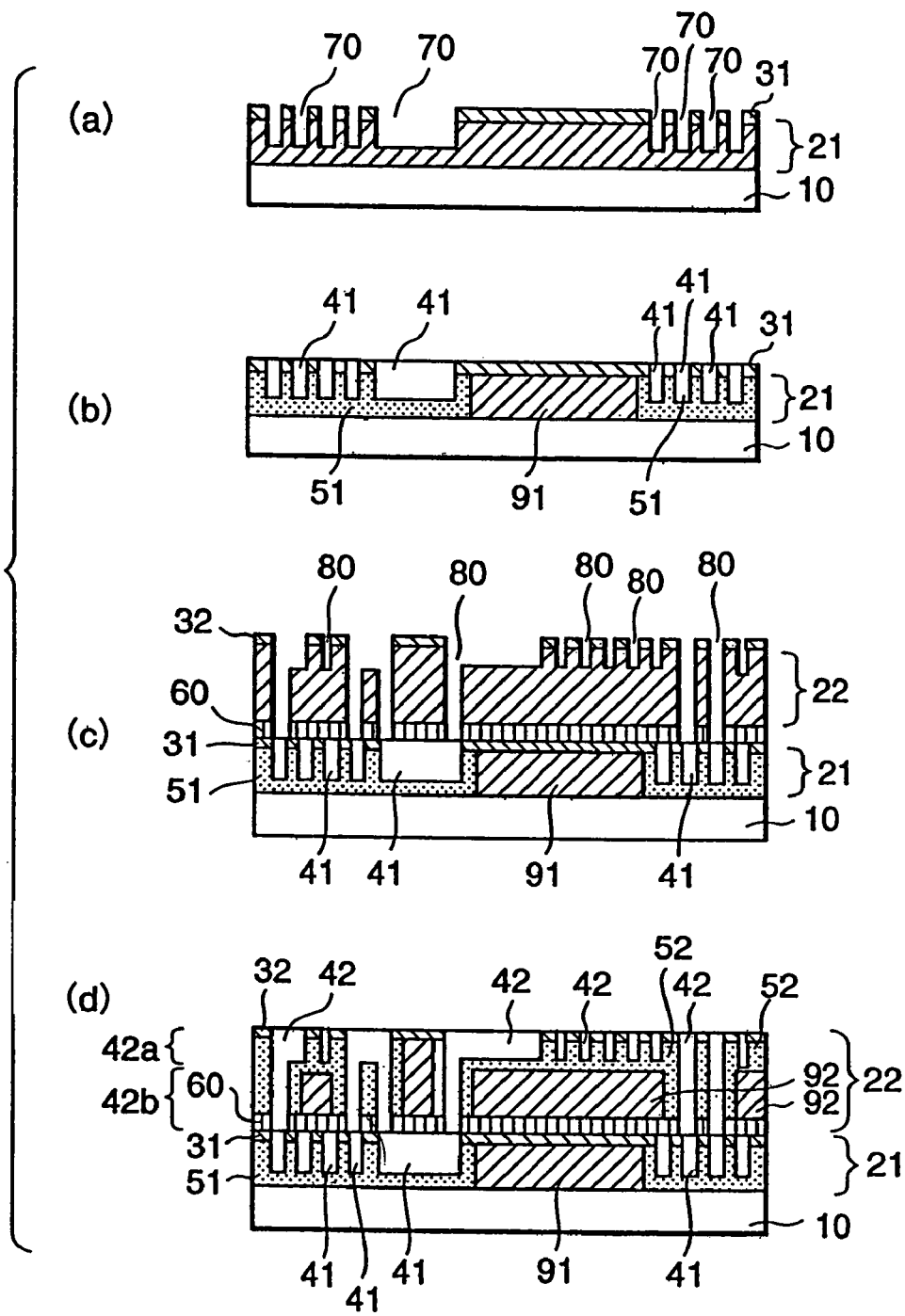
FIG. 2 shows the cross-sectional views illustrating the steps in a manufacturing method for the semiconductor device showing the first embodiment in accordance with the present invention.

FIG. 1 and FIG. 2 show the first embodiment in accordance with the present invention, wherein FIG. 1 is a cross-sectional view of a semiconductor device according to the first embodiment, and FIGS. 2(a) through 2(d) are cross-sectional views illustrating the steps in a manufacturing method for the semiconductor device according to the embodiment.

Referring to FIG. 1, the semiconductor device according to this embodiment is constructed by a semiconductor substrate 10 on which a plurality of elements making up, for example, a logic type device, have been formed, and a first interlayer insulating film 21 of a first insulating film formed on the semiconductor substrate 10.

The first interlayer insulating film 21 is provided with groove patterns 70 formed of a plurality of grooves. A plurality of lower interconnections 41 are formed by embedding electroconductive films composed of an electroconductive material containing, for example, copper (Cu) in the respective grooves of the groove patterns 70.

In this embodiment, a plurality of the lower interconnections 41 include third, fourth, fifth, and sixth conductive patterns that are provided so that they are spaced away from each other. These conductive patterns are arranged so that the distance from the third conductive pattern to the fourth conductive pattern is shorter than the distance from the fifth conductive pattern to the sixth conductive pattern.

According to the semiconductor device of this embodiment, a plurality of grooves are formed in the lower porous portions of the first insulating film, and a plurality of lower interconnections is formed by embedding conductive materials in these grooves. Therefore, the sides of each conductive pattern comprising the lower interconnections are contact with the lower porous portion.

For example, the first insulating film between the third and fourth conductive patterns having a shorter interval therebetween is comprised first porous portions 513 which is the part of the lower porous portions. In other words, between the third and fourth conductive patterns with a shorter interval provided therebetween, a porous portion 513 extends from the third conductive pattern to the fourth conductive pattern is provided such that the porous portion 513 is in contact with the sides of the third and fourth conductive patterns.

Furthermore, the first insulating film between the fifth and sixth conductive patterns having a longer interval therebetween, is comprised first porous portions 515, 516 and a nonporous portion 91. The first porous portions 515 which is contact with the fifth conductive pattern and the first porous portions 516 which is contact with the sixth conductive pattern are the part of the lower porous portions. The nonporous portion 91 is contact with the first porous portions 515, 516.

In addition, in the semiconductor device according to this embodiment, a silicon nitride film 60 and a second interlayer insulating film 22, which is a second insulating film, are formed on the first interlayer insulating film 21 and the lower interconnections 41. The second interlayer insulating film 22 and the silicon nitride film 60 have an opening 80 formed of a groove wherein an upper layer conductive pattern 42a is formed therein and a connection hole extending from the bottom of the groove to the lower interconnections 41.

A upper interconnection 42 composed of the upper layer conductive pattern 42a formed using an etectroconductive film containing copper (Cu), as in the case of the lower interconnections 41, and a connecting plug 42b is formed in the opening 80. The second interlayer insulating film 22 with the upper interconnection 42 is further provided with a second porous portion 52 formed by perforating a part of the second interlayer insulating film 22 that is in contact with the upper interconnection 42, and nonporous portions 92.

Thus, the semiconductor device according to this embodiment has a multilayer wiring structure constructed by the lower interconnections 41 and the upper interconnections 42.

In the present invention, the first and second porous portions 51 and 52 formed in the portions in contact with the conductive patterns are composed of an insulating film that contains approximately 70% of an additive and a plurality of microscopic voids that occupy approximately 70% of the entire area.

Furthermore, in the semiconductor device according to this embodiment, the silicon nitride film 60 formed by the plasma CVD process or the like is provided on the lower interconnections 41 and a first cap insulating film 31 to prevent the conductive pattern material constituting the lower interconnections 41 from oxidizing or diffusing. The silicon nitride film used in this embodiment may be replaced by a silicon carbide film or the like.

The manufacturing method for the semiconductor device according to the first embodiment will now be described with reference to the accompanying drawings. FIG. 2(a) through FIG. 2(d) are cross-sectional views illustrating the steps in the manufacturing method for the semiconductor device according to the first embodiment. In FIG. 2, like components will be assigned like reference numerals.

In the semiconductor device according to this embodiment, on the semiconductor substrate 10 on which a plurality of elements making up, for example, a logic type device, have been formed, the first interlayer insulating film 21 using an insulating film with low dielectric constant containing about 70% of an additive, such as methyl silsesquioxane (MSQ), which is an alkylsiloxane polymer, is formed to about 500 nm to 700 nm, as shown in FIG. 2(a). In this embodiment, the MSQ has been used as the additive; however, methyl hydridesilsesquioxane (MHSQ) or the like may alternatively be used as the alkylsiloxane polymer instead of MSQ.

The silicon oxide film containing the MSQ making up the first interlayer insulating film 21 on the semiconductor substrate 10 is formed by mixing a silanol-based SOG generally known as spin-on-glass (SOG) and MSQ and applying the mixture.

After the silicon oxide film containing the MSQ is applied, the assembly is subjected to hot plate baking for about one minute at temperatures about 100° C., 200° C., and 300° C., respectively, as in a typical SOG process, thereby forming the first interlayer insulating film 21 on the semiconductor substrate 10. The assembly is further subjected to curing at about 400° C. to about 450° C. in a furnace for about 30 minutes thereby to remove impurities from the first interlayer insulating film 21 that may adversely affect a subsequent heat treatment.

Thereafter, a silicon oxide film serving as the first cap insulating film 31 is formed to about 100 nm on the first interlayer insulating film 21 by tetraethoxysilane oxygen (TEOS $O_2$) plasma. This silicon oxide film is formed for the following reason. When the groove patterns 70 are formed by making a mask that employs a photoresist intended for use on a standard inorganic film, providing just the first interlayer insulating film 21 containing MSQ, which is an organic material, is not enough to obtain sufficient adhesion to the photoresist. Forming the first cap insulating film 31 on the first interlayer insulating film 21 improves the adhesion between the photoresist and the first interlayer insulating film 21 when forming the groove patterns 70.

In this embodiment, the first interlayer insulating film 21 is formed first, then the first cap insulating film 31 is formed by the TEOS $O_2$ plasma. However, the first cap insulating film 31 is not limited to the silicon oxide film formed by the TEOS $O_2$ plasma. Alternatively, prior to the formation of the groove patterns 70 after the formation of the first interlayer insulating film 21 is completed, oxygen ion is irradiated by low pressure oxygen plasma to oxidize the surface of the first interlayer insulating film 21 so as to form a dense modified film to about 50 nm on the surface of the first interlayer insulating film 21. This modified film may be used as the first cap insulating film. The cap insulating film formed of the modified film is substantially equivalent to the cap insulating film composed of the silicon oxide film produced by the TEOS $O_2$ plasma.

The oxygen ions are irradiated for producing the modified film at an RF power ranging from several hundred to several thousand watts and at a pressure ranging from several ten to several hundred mTorr. To decrease the thickness of the modified film, the oxygen ion irradiation is performed at a lower pressure (e.g., 100 mTorr or less). To make a thicker film, the oxygen ion irradiation is performed at a higher pressure (e.g., higher than 100 mTorr).

Thus, using the modified film that has been formed by the oxygen ion irradiation with low pressure oxygen plasma for the first cap insulating film 31 makes it possible to reduce the film thickness by about half, as compared with the cap insulating film produced by the TEOS $O_2$ plasma. This means that using the modified film for the cap insulating film enables the cap insulating film, which is not a film with low dielectric constant, to be made even thinner. As a result, a semiconductor device with further reduced inter-conductive pattern capacitance can be achieved. Moreover, when the cap insulating film employs the modified film, exchanging gases, which is required for forming a silicon oxide film by the TEOS $O_2$ plasma, is no longer necessary. This allows a cap insulating film to be formed with fewer steps.

After the first cap insulating film 31 is formed, a photoresist is applied onto the first cap insulating film 31. Thereafter, etching is carried out, using the photoresist as the mask thereby to form the groove patterns 70 on the first interlayer insulating film 21.

The etching characteristics of the silicon oxide film containing MSQ in this embodiment do not significantly different from those of a typical silicon oxide film. Therefore, in this embodiment, the groove patterns 70 are formed according to a conventional etching process.

After the groove patterns 70 are formed, the photoresist remaining on the first interlayer insulating film 21 is removed by anisotropic ashing that employs oxygen ion irradiation in an $O_2$ atmosphere at low pressure. To remove the photoresist, the oxygen ion irradiation is performed at an RF power ranging from several hundred to several thousand watts and at a pressure ranging from several ten to several hundred mTorr.

In this embodiment, the photoresist has been removed by the anisotropic ashing that uses the oxygen ion irradiation by the low pressure oxygen plasma. Alternatively, however, the photoresist may be removed by isotropic ashing, which is normally used.

However, in this embodiment using the silicon oxide film that contains the methyl-MSQ as the interlayer insulating film, if the normal isotropic ashing is performed to remove the photoresist, the surface of the first interlayer insulating film 21 may be oxidized by the $O_2$ plasma for removing the photoresist, causing moisture to be generated inside the interlayer insulating film. The moisture generated in the interlayer insulating film has an extremely high dielectric constant, making it difficult to achieve a lower dielectric constant with the interlayer insulating film containing moisture. For this reason, it is desirable to remove the photoresist by the oxygen ion irradiation by means of low pressure oxygen plasma (anisotropic ashing) in this embodiment.

When the photoresist is removed by the anisotropic ashing, there is a danger in that a modified film of about 10 nm is formed also on the bottom of each of the groove patterns 70 by the oxygen ion irradiation by means of the low oxygen plasma, depending on the pressure condition, leaving an unperforated portion. Preferably, therefore, when providing the porous portion brought in contact with the bottom surface of each conductive pattern, the anisotropic ashing is carried out at a pressure of about 10 mTorr, then surface treatment is performed with 0.5% hydrofluoric acid (HF) for ten seconds.

In the next step, as illustrated in FIG. 2(b), the first porous portions 51 of about 100 nm to about 400 nm are provided on the portions in contact with the side surfaces and the bottom surfaces of the lower interconnections 41 to be formed later by embedding an electroconductive material in a plurality of the groove patterns 70.

In this embodiment, after the groove patterns 70 are formed, the first interlayer insulating film 21 including the groove patterns 70 is exposed to a tungsten hexafluoride ($WF_6$) gas to cause $WF_6$ and MSQ to react so as to eliminate only the MSQ component contained in the first interlayer insulating film 21 around the groove patterns 70. Thus, a part of the first interlayer insulating film 21 with a plurality of the groove patterns 70 formed therein is selectively perforated to form the first porous portions 51.

Figure 3:
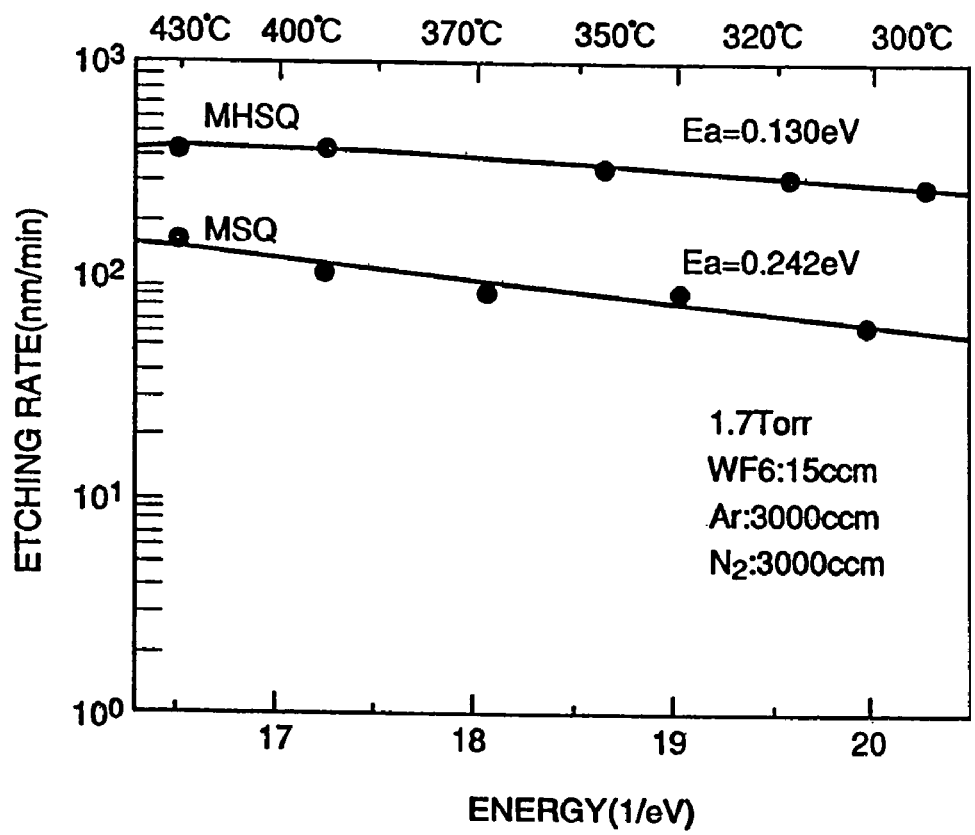
FIG. 3 is a graph showing an etching rate by $WF_6$ of a methylsiloxane acid type polymer.

The descriptions will now be given of the reaction between alkylsiloxane polymers and $WF_6$ used in the first embodiment. FIG. 3 shows the etching rate obtained by $WF_6$ in the alkylsiloxane polymers. The axis of ordinate indicates the etching rates of the polymers and $WF_6$, while the axis of abscissa indicates energy and temperature. In the graph, Ea denotes the activating energy in each material. The $WF_6$ etching conditions in FIG. 3 are defined as follows: temperature ranges from 300° C. to 430° C., pressure is 1.7 Torr, gas flow rate $WF_6$ (15 ccm), Ar (3000 ccm), $N_2$ (300 ccm), and MSQ and MHSQ are used as the alkylsiloxane polymers.

From FIG. 3, it is understood that the alkylsiloxane polymers, namely, MSQ and MHSQ, react with $WF_6$ and are etched. Hence, according to the present invention, the first interlayer insulating film 21 to which the methylsiloxane-based polymers have been added is formed on the semiconductor substrate 10, and after a plurality of the groove patterns 70 are formed in the first interlayer insulating film 21, the methylsiloxane-based polymers that have been added to the first interlayer insulating film 21 around the groove patterns 70 are removed by $WF_6$ to selectively perforate a part of the first interlayer insulating film with the groove patterns 70 formed therein. Thus, the first porous portions 51 are formed. Accordingly, in the semiconductor device according to this embodiment, a first interlayer insulating film containing the MHSQ, which is etched more easily, should be used to form adequately perforated first porous portions 51 on the side and bottom surfaces of the groove patterns 70.

In this embodiment, the reaction between the MSQ contained in the first interlayer insulating film 21 and $WF_6$ is progressed from the side surfaces of the individual groove patterns 70 to remove the MSQ around the groove patterns 70, thereby forming the first porous portions 51. Therefore, the reaction between $WF_6$ and the MSQ does not take place in the portion of the first interlayer insulating film 21 that is away from the groove patterns 70, so that the MSQ in the first interlayer insulating film 21 will not be removed. As a result, if the intervals among the groove patterns 70 are wide, then the first porous portions 51 are provided around the groove patterns 70 through the intermediary of the nonporous portion 91, which is the portion of the first interlayer insulating film 21 from which the MSQ has not been removed.

According to a manufacturing method in this embodiment, it is possible to form the first porous portions 51 of about 400 nm from the side surfaces of the groove patterns 70. Thus, among a plurality of the groove patterns 70 provided in the first interlayer insulating film 21, the portion where the intervals among the groove patterns 70 are shorter, e.g., a portion where the intervals among the groove patterns 70 are approximately within 800 nm, the reaction of $WF_6$ and the MSQ contained in the first interlayer insulating film 21 progresses from the side surfaces of the individual groove patterns 70. As a result, the entire first interlayer insulating film 21 among the groove patterns 70 is perforated, so that the porous portion is provided all over the groove patterns with shorter intervals. In other words, it is possible to selectively provide the interlayer insulating film having a lower dielectric constant on the portion where the intervals of the groove patterns 70 are shorter, producing more inter-conductive-pattern capacitance.

Thereafter, barrier metal is formed in the groove patterns 70, and a film containing an electroconductive material, such as copper (Cu), for producing conductive patterns is formed on the barrier metal, thus covering the groove patterns 70 with the electroconductive film. Then, the electroconductive film is removed from the top of the groove patterns 70 and the first interlayer insulating film 21 by the CMP process or the like so as to leave the electroconductive film in the groove patterns 70, thereby forming a plurality of the lower interconnections 41.

Furthermore, in this embodiment, after the lower interconnections 41 are formed, a silicon nitride film 60 for preventing the conductive patterns from oxidizing or diffusing is formed on the lower interconnections 41 and the first interlayer insulating film 21, as illustrated inD, in order to implement a semiconductor device having the multilayer wiring structure. In the next step, a second interlayer insulating film 22, which is the second insulating film, and a second cap insulating film 32 are formed in sequence on the silicon nitride film 60. The second interlayer insulating film 22 employs an organic insulating film with a low dielectric constant to which MSQ or the like has been added, as in the case of the first interlayer insulating film 21.

Thereafter, in the same manner as that for forming the lower interconnections 41, a photoresist is applied onto the second cap insulating film 32. Using this photoresist as the mask, etching is carried out to form the opening 80 in the second interlayer insulating film 22 on the lower interconnections 41. The opening 80 is constructed by the grooves wherein upper interconnections 42 will be formed by an electroconductive material to fill the grooves later and a connection hole extending from the bottom surfaces of the grooves to the lower interconnections 41.

After the formation of the opening 80, the photoresist is removed. For this removal of the photoresist, it is preferable to use the anisotropic ashing by oxygen ion irradiation by means of the low pressure oxygen plasma to remove the photoresist for the same reason as that for the groove patterns 70.

When forming the opening 80, the removal of the photoresist by the anisotropic ashing may cause a modified film of about 10 nm to be undesirably formed on the bottom of the groove of the opening 80, as in the case of the formation of the groove patterns 70. To avoid this, therefore, it is preferable to remove the photoresist by the anisotropic ashing at a pressure of about 10 mTorr to provide a porous portion contacting the bottom surface of upper layer conductive patterns, then to perform the 10-second surface treatment with 0.5% hydrofluoric acid (HF) before providing the second porous portion 52.

Subsequently, as illustrated in FIG. 2(d), second porous portions 52 of about 100 nm to about 400 nm are provided on the side surfaces and the bottom surfaces of the upper interconnections 42 composed of upper layer conductive patterns 42a formed by filling the grooves in the openings 80 with an electroconductive material and of connecting plugs 42b formed in the connection holes.

In this embodiment, after forming the openings 80, the second interlayer insulating film 22 including the openings 80 is exposed to a tungsten hexafluoride ($WF_6$) gas to cause $WF_6$ and MSQ to react so as to eliminate only the MSQ component contained in the second interlayer insulating film 22 around the openings 80. Thus, a part of the second interlayer insulating film 22 with the openings 80 formed therein is selectively perforated to form the second porous portions 52, whereby nonporous portions 92 remain.

After that, barrier metal is formed in the openings 80, and a film containing an electroconductive material, such as copper (Cu), for producing conductive patterns is formed on the barrier metal, thus covering the openings 80 with the electroconductive film. Then, the electroconductive film is removed from the top of the openings 80 and the second interlayer insulating film 22 by the CMP process or the like so as to leave the electroconductive film only in the openings 80, thereby forming the upper interconnections 42. In short, this embodiment employs a dual damascene process in which the openings 80 composed of the grooves and the connection holes are formed first, then the electroconductive film is embedded in the openings 80 to form the upper layer conductive patterns 42a and the connecting plugs 42b at the same time. In this way, the semiconductor device according to the first embodiment is fabricated.

In this embodiment, the descriptions have been given by taking the insulating films with low dielectric constants that contain the alkylsiloxane polymers, such as MSQ and MHSQ, that react with $WF_6$, as the examples of the first and second interlayer insulating films 21 and 22. Alternatively, however, the first and second interlayer insulating films 21 and 22 may be formed of the insulating films with low dielectric constants that contain a different organic polymer, such as hydrogen silsesquioxane (HSQ) or polyallyl ether and the like, which is an organic polymer reacting with $O_2$ plasma.

As described in detail above, according to the first embodiment, after the groove patterns and the openings in which the conductive patterns are to be formed later are provided in the interlayer insulating films, the interlayer insulating films are exposed to the $WF_6$ gas to cause the additive MSQ contained in the interlayer insulating films to react with $WF_6$ thereby to remove the additive MSQ contained in the interlayer insulating films around the groove patterns and the openings. The porous portions 51 and 52 that are in contact with the side surfaces and bottom surfaces of the first and upper interconnections 41 and 42 and have lower dielectric constants are selectively provided in the portions of the insulating films on the semiconductor substrate 10.

Especially in the semiconductor device according to the embodiment, which is provided with a plurality of conductive patterns in the horizontal direction, the porous portions formed by perforating the entire insulating film are provided among the conductive patterns with smaller intervals between adjoining conductive patterns such that they are in contact with the side surfaces of the individual conductive patterns. Furthermore, the porous portions in contact with the side surfaces of the conductive patterns and the nonporous portions disposed among the above porous portions are provided among the conductive patterns having larger intervals between adjoining conductive patterns.

Hence, in this embodiment, to cope with an increase in the capacitance among the horizontal conductive patterns that is responsible for a retardation in the operation of the device, the porous portions having a dielectric constant that is still lower than that of a regular low-dielectric constant insulating film are provided among the conductive patterns having smaller intervals, which tend to develop an increase in inter-connection capacitance. For the conductive patterns with larger intervals that do not develop a considerable increase in the inter-connection capacitance, the nonporous portions exhibiting sufficiently high mechanical strength and thermal conductivity, as compared with the porous portions, are provided among the porous portions in contact with the conductive patterns.

As a result, according to the semiconductor device in this embodiment, it is possible to reduce the capacitance between horizontally adjoining conductive patterns that is a dominant parameter in reducing the inter-connection capacitance, and also to minimize a drop in the mechanical strength and the thermal conductivity of the interlayer insulating films.

In a specific semiconductor device to which the present invention has been applied, the provision of the porous portions has made it possible to realize an interlayer insulating film having a relative dielectric constant $\epsilon$ of approximately 1.87.

According to the manufacturing method for the semiconductor device in the first embodiment, after forming the groove patterns and the openings, the additive contained in the interlayer insulating film in contact with the side surfaces and bottom surfaces of the conductive patterns is removed thereby to provide the porous portions. Hence, the manufacturing method according to this embodiment makes it possible to adjust the number of voids included in the porous portions, which is deeply involved in reducing the inter-connection capacitance and maintaining mechanical strength and thermal conductivity, by changing the quantity of the additive to be added to the interlayer insulating films.

Thus, a semiconductor device having optimum conductive pattern capacitance, mechanical strength, and thermal conductivity can be easily provided.

In other words, according to the embodiment, for a semiconductor device that is fabricated by the damascene process and has an interlayer insulating film composed of an insulating material with low dielectric constant, it is possible to provide an interlayer insulating film that secures satisfactory mechanical strength and thermal conductivity of the interlayer insulating film while reducing conductive pattern capacitance in the interlayer insulating film. This enables a sufficiently fast device operation to be achieved in a semiconductor device with higher integration.

A second embodiment according to the present invention will now be described with reference to the accompanying drawings.

Figure 4:
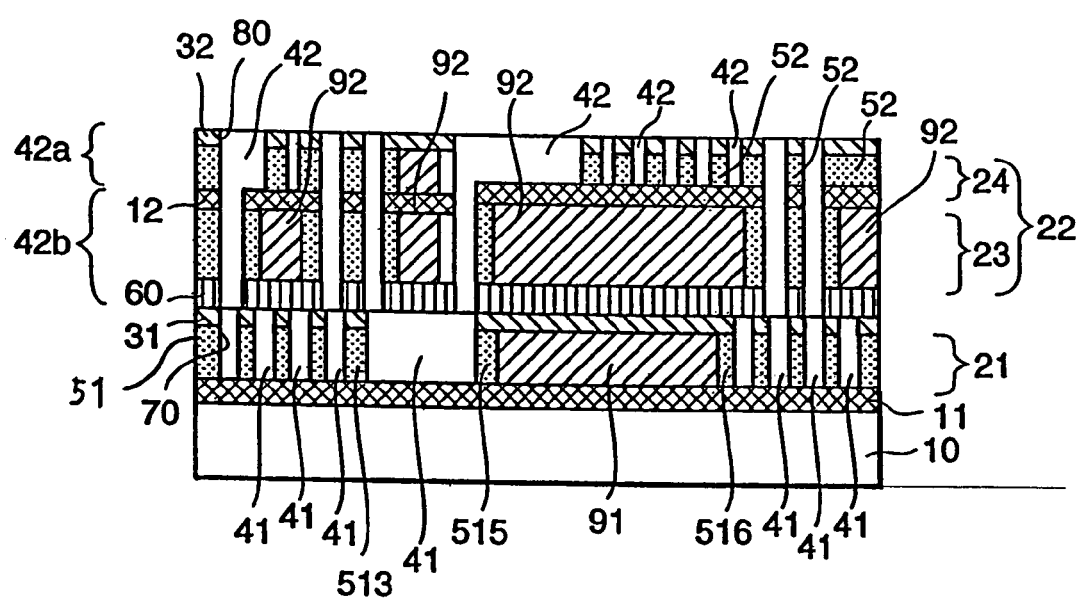
FIG. 4 is a cross-sectional view of a semiconductor device showing a second embodiment in accordance with the present invention.
Figure 5:
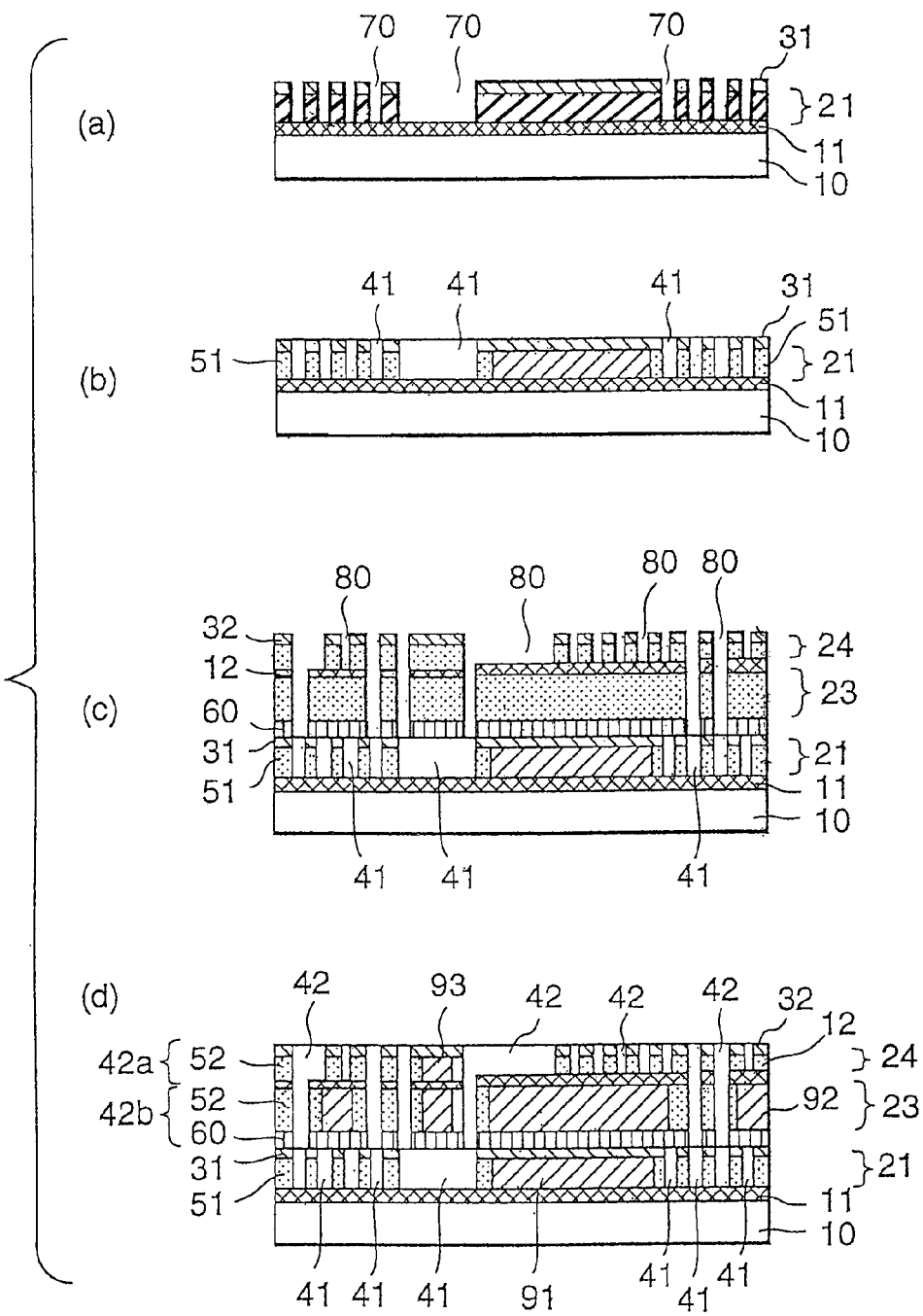
FIG. 5 shows the cross-sectional views illustrating the steps in a manufacturing method for the semiconductor device showing the second embodiment in accordance with the present invention.

FIG. 4 and FIG. 5 illustrate the second embodiment according to the present invention, wherein FIG. 4 is a cross-sectional view of a semiconductor device according to the embodiment, and FIG. 5(*a*) through 5(*d*) are cross-sectional views illustrating the steps of a manufacturing method for the semiconductor device according to the embodiment. In FIG. 4 and FIG. 5 also, like components as those in the first embodiment are assigned like reference numerals.

The semiconductor device according to the second embodiment differs from the first semiconductor device described above in that a nonporous portion, which is not perforated, is provided in a portion in contact with the bottom surfaces of upper layer conductive patterns making up lower interconnections and upper interconnections.

Referring to FIG. 4, the semiconductor device according to the second embodiment is constructed by a semiconductor substrate 10 on which a plurality of elements as those in the first embodiment are formed, a silicon oxide film 11 formed on the semiconductor substrate 10 by, for example, the plasma CVD process, and a first interlayer insulating film 21 formed on the silicon oxide film 11. For the first interlayer insulating film 21 formed on the silicon oxide film 11, an insulating film containing MSQ as an additive is used as in the case of the semiconductor device according to the first embodiment.

The first interlayer insulating film 21 is provided with a plurality of groove patterns 70 that reach the silicon oxide film 11. An electroconductive film composed of an electroconductive material, including Cu, is embedded in each of the groove patterns 70 thereby to form a plurality of lower interconnections 41. Furthermore, a first cap insulating film 31 is formed on the first interlayer insulating film 21 and the lower interconnections 41.

Thus, in the semiconductor device according to this embodiment, the first interlayer insulating film 21 containing an additive substance is formed on the silicon oxide film 11 that is provided on the bottom surfaces of the lower interconnections 41 and does not contain the additive substance to be removed. Therefore, the silicon oxide film 11 is provided as a first nonporous portion in the portion in contact with the bottom surfaces of the lower interconnections 41. In the first interlayer insulating film 21 having the lower interconnections 41 therein, the additive substance contained in the areas around the groove patterns 70 is removed in the portion in contact with the side surfaces of the lower interconnections 41, thereby perforating a part of the first interlayer insulating film 21 to provide the first porous portions 51, wherby nonporous portion 91 remain.

Furthermore, in this embodiment also, the silicon nitride film 60 and the second interlayer insulating film 22 are formed in this order on the lower interconnections 41 and the first cap insulating film 31, and the upper interconnections 42 are formed on the second interlayer insulating film 22, thereby fabricating the semiconductor device that has the multilayer wiring structure, as in the case of the semiconductor device according to the first embodiment.

This embodiment is different, however, in that the second interlayer insulating film 22 is composed of three layers, namely, a third interlayer insulating film 23 that contains an additive substance to be removed, the silicon film 12 that is formed by, for example, the plasma CVD process or the like and does not contain an additive substance to be removed, and a fourth interlayer insulating film 24 that contains an additive substance to be removed, as in the third interlayer insulating film 23.

Furthermore, in this embodiment, the opening 80 provided in the second interlayer insulating film 22 is comprised of a groove that is formed in the fourth interlayer insulating film 24 and extend to the silicon oxide film 12, and a connection hole that is formed in the silicon oxide film 12, the third interlayer insulating film 23, and the silicon nitride film 60, and extends to the lower interconnection 41 from the bottom of the groove.

As in the case of the first embodiment, an electroconductive film containing Cu is embedded in the opening 80, and the upper interconnection 42 composed of the upper layer conductive pattern 42a and the connecting plug 42b is formed.

Thus, in this embodiment, the films 21, 22, and 23 containing MSQ, which is the additive substance to be removed, are respectively formed on the side surfaces of the lower interconnections 41 and the upper interconnections 42. In addition, the silicon oxide films 11 and 12 that do not contain the additive substance to be removed are formed on the bottom surfaces of the lower interconnections 41 and the upper layer conductive patterns 42a of the upper interconnections. Thus, porous portions 52 and non-porous portions 92 are included in second interlayer insulating film 22.

The manufacturing method for the semiconductor device according to the second embodiment will now be described in conjunction with the accompanying drawings. The semiconductor device according to the second embodiment is fabricated by the process substantially similar to that of the manufacturing method for the semiconductor device according to the first embodiment explained above.

FIG. 5(a) through FIG. 5(d) are cross-sectional views illustrating the steps of the manufacturing method for the semiconductor device according to the second embodiment. In FIG. 5 also, like components as those in the first embodiment are assigned like reference numerals.

First, as shown in FIG. 5(a), the silicon oxide film 11, which is an insulating film free of an additive substance, such as MSQ, and which is formed by, for example, the plasma CVD process is formed to about 100 nm on the semiconductor substrate 10 on which a plurality of elements have been formed. Thereafter, the first interlayer insulating film 21 containing the additive substance, such as MSQ, to be removed by, for example, the reaction with $WF_6$, is formed to about 500 nm to 700 nm on the silicon oxide film 11. Then, the first cap insulating film 31 is formed to about 100 nm on the first interlayer insulating film 21.

After forming the first cap insulating film 31, a photoresist is applied onto the first cap insulating film 31. After that, etching is performed, using the photoresist as the mask, thereby to form a plurality of groove patterns 70, which extends to the silicon oxide film 11, on the first interlayer insulating film 21. After the groove patterns 70 are formed, the photoresist left on the first interlayer insulating film 21 is removed by the anisotropic ashing that employs the oxygen ion irradiation by means of low pressure oxygen plasma for the same reason as that in the first embodiment.

Following the removal of the photoresist described above, first porous portions 51 of about 100 nm to 400 nm are provided on the portions in contact with the side surfaces of the lower interconnections 41 that are formed later by embedding an electroconductive material in the groove patterns 70, as illustrated in FIG. 5(b).

As in the manufacturing method according to the first embodiment, in the second embodiment, after the groove patterns 70 are formed, the first interlayer insulating film 21 on the side surfaces of the groove patterns 70 and the silicon oxide film 11 on the bottom surfaces of the groove patterns 70 are exposed to $WF_6$ so as to cause $WF_6$ and MSQ contained in the first interlayer insulating film 21 to react with each other, thereby removing the films. Thus, the first porous portions of about 100 nm to 400 nm are selectively provided on the side surfaces of the groove patterns 70. At this time, no perforation takes place in the silicon oxide film 11, which does not contain MSQ, so that no porous portions are provided on the bottom surfaces of the groove patterns 70. In other words, a nonporous portion composed of the silicon oxide film 11 is provided on the bottom surfaces of the lower interconnections 41.

Thereafter, in this embodiment, as illustrated in FIG. 5(c), the lower interconnections 41 are formed in the groove patterns 70, and a silicon nitride film 60 for preventing the oxidization or diffusion of a conductive pattern material is formed on the lower interconnections 41 or the first interlayer insulating film 21, as in the case of the first embodiment.

Then, a third interlayer insulating film 23 containing an additive substance, such as MSQ, that will be removed by the reaction in a subsequent step, a silicon oxide film 12 that does not contain MSQ, and a fourth interlayer insulating film 24 to which MSQ has been added as in the third interlayer insulating film are deposited in sequence on the silicon nitride film 60. These films make up the second interlayer insulating film 22 in the semiconductor device according to this embodiment. After the second interlayer insulating film 22 is formed, a cap insulating film 32 for improving the adhesion to the photoresist is formed on the fourth interlayer insulating film 24, which is one of the component layers of the second interlayer insulating film 22.

In the succeeding step, the photoresist is applied onto the second cap insulating film 32 according to the same method for forming the lower interconnections 41 previously described. Using the photoresist as the mask, etching is performed to form the openings 80, which extend to the lower interconnections, in the second interlayer insulating film 22.

The openings 80 provided in the second interlayer insulating film 22 are formed by first being provided with grooves that extend to the fourth interlayer insulating film 24 and the silicon oxide film 12, then provided with the connecting holes extending from the bottom surfaces of the grooves to the lower interconnections 41.

After the openings 80 are formed, the photoresist is removed by anisotropic ashing that employs the oxygen ion irradiation by means of the low pressure oxygen plasma.

Thereafter, as shown in FIG. 5(d), the second and third interlayer insulating films 22 and 23, respectively, on the side surfaces of the openings 80 composed of the grooves and the connecting holes, and the silicon oxide film 12 on the bottom surfaces of the grooves are exposed to, for example, a $WF_6$ gas to cause the MSQ, which is contained in the interlayer insulating films 23 and 24 on the side surfaces of the openings 80, to react with $WF_6$, thereby removing the MSQ component in the vicinity of the third and fourth interlayer insulating films 23 and 24 in contact with the side surfaces of the openings 80. Thus, the second porous portions 52 of about 100 nm to 400 nm are selectively formed on a part of the third and fourth interlayer insulating films 23 and 24 on the side surfaces of the openings 80. At this time, no perforation takes place in the silicon oxide film 12 on the bottom surfaces of the grooves, which does not contain MSQ, so that no porous portions are provided on the bottom surfaces of the groove where upper layer conductive patterns 42$a$ are formed. In other words, a nonporous portion composed of the silicon oxide film 12 is provided on the bottom surfaces of the upper layer conductive patterns 42$a$. Also, nonporous portions 92 are included in third interlayer insulating film 23, and nonnorous portion 93 is included in fourth interlayer insulating film 24.

Subsequently, the upper layer conductive patterns 42$a$ and the connecting plugs 42$b$ are formed to provide the upper interconnections 42, as in the case of the first embodiment. Thus, the semiconductor device according to the second embodiment is fabricated.

Basically, the semiconductor device according to the second embodiment is different from the semiconductor device according to the first embodiment in that the porous areas are formed only in the interlayer insulating film on the side surfaces of the conductive patterns that considerably contribute to a reduction in the horizontal inter-connection-capacitance responsible for retardation in a device operation, and the nonporous portions are provided on the bottom surfaces of the conductive patterns that considerably contribute to the maintenance of mechanical strength and thermal conductivity. In the first embodiment, the porous portions are formed on the side surfaces and the bottom surfaces of the individual conductive patterns. As a result, the nonporous portions exhibiting high thermal conductivity that are provided on the bottom surfaces of the conductive patterns enable the semiconductor device according to the second embodiment to secure an adequate escape of heat at the bottom surfaces of the conductive patterns, as compared with the semiconductor device according to the first embodiment previously explained. In particular, the semiconductor device according to the second embodiment is able to efficiently release the heat to the outside from the conductive patterns that is generated as the device operates, making the semiconductor device extremely useful when, for example, it incorporates elements that produce much heat.

Moreover, in this embodiment, a film with low dielectric constant, such as a silicon oxide film, to which fluorine (F) has been added may be used for the silicon oxide films 11 and 12 in order to further reduce the dielectric constants of the interlayer insulating films.

In this case, however, the additive substance to be added to the silicon oxide films 11 and 12 must be the material that will not be removed in the subsequent step for forming the porous portions by removing an additive substance, meaning that it must be a material that does not react with $WF_6$ in the second embodiment.

FIGS. 5($a$) through 5($d$) illustrate an example of the semiconductor device according to the second embodiment and the manufacturing method therefor. The silicon oxide films 11 and 12, which are free of an additive substance to be removed in a subsequent step, are formed in advance on the substrate 10 and the third interlayer insulating film 23 by the plasma CVD process, and the conductive patterns are formed on the silicon oxide films 11 and 12, thereby providing the nonporous portions, which are not perforated, on the bottom surfaces of the upper layer conductive patterns of the lower interconnections and the upper interconnections. Furthermore, the porous portions 51 and 52 are selectively provided on the side surfaces of the conductive patterns.

Figure 6:
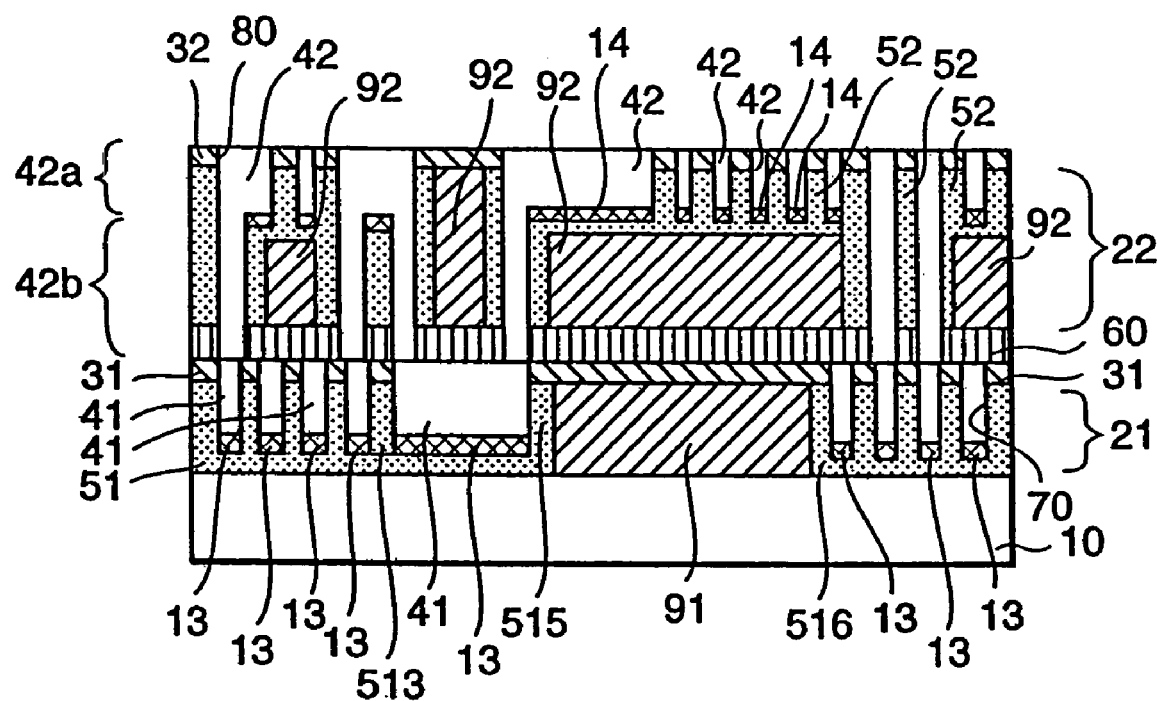
FIG. 6 is cross-sectional view of a semiconductor device in another mode of the second embodiment in accordance with the present invention.

In the semiconductor device according to this embodiment, however, the nonporous portions provided on the bottom surfaces of the conductive patterns do not have to be the silicon oxide films 11 and 12 formed beforehand by the plasma CVD process. Alternatively, modified films 13 and 14 shown in FIG. 6 may be used as the nonporous portions. To produce the modified films 13 and 14, reactive ion etching is performed in an $O_2$ atmosphere under a low pressure for removing a photoresist to oxidize the surface of the interlayer insulating film on the bottom surfaces of the grooves of the groove patterns 70 or the opening 80, thereby making the surface of the provided interlayer insulating films dense.

The modified films 13 and 14 formed on the bottom surfaces of the grooves of the groove patterns 70 or the openings 80 refer to the interlayer insulating films from which MSQ, which is an additive substance, has been removed by the reactive ion etching in the $O_2$ atmosphere under a low pressure to make the interlayer insulating film surfaces dense.

To use the modified films 13 or 14 as nonporous portions, after these films 13 or 14 if formed, the interlayer insulating film is exposed to the $WF_6$ gas to cause the $WF_6$ to react with MSQ contained in the interlayer insulating film in contact with the peripheries of the conductive patterns. This eliminates the MSQ to provide the porous portions.

At this time, the portions of the modified film 13 or 14 in contact with the bottom surfaces of the conductive patterns do not contain MSQ to be removed; therefore, the bottom surfaces of the conductive patterns are not perforated, and the nonporous portions are formed on the bottom surfaces of the conductive patterns. Thus, using the modified film 13 or 14 makes it possible to provide the semiconductor device according to the second embodiment that has the nonporous portions in contact with the bottom surfaces of the conductive patterns and the porous portions in contact with the side surfaces of the conductive patterns, whereby nonporous portions 92 are also included.

If the modified film 13 or 14 formed by the oxygen ion irradiation for removing a photoresist is used as the nonporous portions, then the surface of the interlayer insulating film in contact with the bottom surfaces of the conductive patterns must be also oxidized at the same time by the oxygen ion irradiation for removing a photoresist. For this reason, when manufacturing the semiconductor device shown in FIG. 6, it is necessary to perform the oxygen ion irradiation at a pressure level that is higher than the pressure level used for removing only the photoresist in the manufacture of the semiconductor device employing the silicon oxide films 11 and 12 as the nonporous portions. To be more specific, it is preferable to use a pressure level of about 500 mTorr.

In other words, the unperforated film on the pattern bottom surfaces where the conductive patterns are formed can be formed by the oxygen ion irradiation by means of the low pressure oxygen plasma for removing a photoresist. Thus, unlike the formation method based on the plasma CVD process, there is no need to form the silicon oxide films beforehand on the semiconductor substrate 10 and the third interlayer insulating film 23. This arrangement makes it possible to fabricate, with fewer steps, the semiconductor device according to the second embodiment provided with the nonporous portions on the bottom surfaces of the conductive patterns and the porous portions 51 and 52 on the side surfaces of the conductive patterns.

In the present invention, the porous portions provided around the conductive patterns are not limited to those formed by removing an additive substance from the interlayer insulating film containing the additive substance. Alternatively, the porous portions may be provided on the side walls and bottom surfaces of the grooves or openings formed in the interlayer insulating films.

As described above, according to the present invention, the interlayer insulating film is provided with the porous portions that are selectively formed in the portions of the interlayer insulating film that are in contact with the side surfaces or the bottom surfaces of the conductive patterns or connecting plugs, and with the nonporous portions, which are not perforated, in the remaining portions free of the porous portions in contact with the conductive patterns. Hence, it is possible to provide an interlayer insulating film having satisfactory mechanical strength and thermal conductivity. In particular, in the present invention, the porous portions are provided in contact with the side surfaces of the conductive patterns and the connecting plugs, making it possible to dramatically reduce the horizontal inter-conductive-pattern capacitance produced among the conductive patterns with small intervals provided therebetween, which is the most dominant parameter in reducing the capacitance among the conductive patterns. As a result, high-speed operation can be achieved even in a semiconductor device with high integration.

In addition, according to the manufacturing method for a semiconductor device in accordance with the present invention, an interlayer insulating film to which a material, such as an alkylsiloxane polymer, has been added is formed on a semiconductor substrate, and the grooves or openings in which conductive patterns are to be embedded are formed, then the assembly is exposed to a gas or plasma that reacts with the added material. This enables the removal of the added material contained in the interlayer insulating film in contact with the peripheries of the conductive patterns, thus selectively forming the porous portions having a lower dielectric constant around the conductive patterns. This arrangement makes it possible to reduce the horizontal inter-conductive-pattern capacitance, which is a dominant parameter, and especially the capacitance among the conductive patterns with small intervals provided therebetween, which is the most dominant parameter in reducing the inter-connection capacitance. Moreover, in the present invention, the nonporous portions exhibiting satisfactory mechanical strength and thermal conductivity are provided among the conductive patterns arranged with large intervals, which is not very dominant in reducing the inter-connection capacitance. Hence, the deterioration in the mechanical strength and the deterioration in the thermal conductivity can be controlled to a minimum as the entire multilayer wiring, while achieving an adequate reduction in the inter-connection capacitance.

Moreover, the manufacturing method in accordance with the present invention makes it possible to decide the number of voids included in the porous portions by adjusting the quantity of an additive substance to be added to an interlayer insulating film. This enables a semiconductor device to be easily provided that exhibits optimum inter-connection capacitance, mechanical strength, and thermal conductivity by adjusting the quantity of an additive to be added to the interlayer insulating film.

In other words, according to this embodiment, in a semiconductor device that is fabricated by the damascene process and has an interlayer insulating film composed of an insulating material with low dielectric constant, it is possible to provide the semiconductor device with the interlayer insulating film that secures satisfactory mechanical strength and thermal conductivity while reducing the inter-connection capacitance. This enables a sufficiently fast device operation to be achieved in a semiconductor device with higher integration.

What is claimed is:

1. A semiconductor device comprising:
   a substrate:
   a first insulating film formed on the substrate, the first insulating film including a first porous insulating portion having a first groove, a second porous insulating portion having a second groove and a nonporous insulating portion located between the first and second porous insulating portions; and
   a plurality of interconnections including a first conductive pattern disposed in the first groove and a second conductive pattern disposed in the second groove,
   wherein the interconnections comprise third, fourth, fifth, and sixth conductive patterns provided spaced away from each other, and
   a distance between the third conductive pattern and the fourth conductive pattern is shorter than a distance between the fifth conductive pattern and the sixth conductive pattern.

2. A semiconductor device according to claim 1, wherein the distance between the third conductive pattern and the fourth conductive pattern is about 800 nm or less.

3. A semiconductor device comprising:
   a substrate;
   a first insulating film formed on the substrate, the first insulating film including a first porous insulating portion having a first groove, a second porous insulating portion having a second groove and a nonporous insulating portion located between the first and second porous insulating portions; and
   a plurality of interconnections including a first conductive pattern disposed in the first groove and a second conductive pattern disposed in the second groove,
   wherein the porous insulating portions are composed of an insulating film that has been perforated at about 70% of an entire area thereof.

4. A semiconductor device comprising:
   a substrate;
   a first insulating film formed on the substrate, the first insulating film including a first porous insulating portion having a first groove, a second porous insulating portion having a second groove and a nonporous insulating portion located between the first and second porous insulating portions; and
   a plurality of interconnections including a first conductive pattern disposed in the first groove and a second conductive pattern disposed in the second groove,
   wherein the insulating film includes an additive substance added thereto.

5. A semiconductor device comprising:

a substrate;

a first insulating film formed on the substrate, the first insulating film including a first porous insulating portion having a first groove, a second porous insulating portion having a second groove and a first nonporous insulating portion located between the first and second porous insulating portions;

a plurality of lower interconnections including a first conductive pattern disposed in the first groove and a second conductive pattern disposed in the second groove;

a second insulating film formed on the first insulating film and the lower interconnections;

a plurality of openings formed in the second insulating film on the lower interconnections; and a plurality of upper interconnections that are embedded in the openings and electrically connected with the lower interconnections, wherein the second insulating film in which the upper interconnections are formed comprises a plurality of third porous insulating portions provided in contact with the upper interconnections, and a plurality of second nonporous insulating portions provided in contact with the third porous insulating portions.

6. A semiconductor device according to claim 5, wherein the third porous insulating portions are composed of the second insulating film comprising a plurality of voids.

7. A semiconductor device according to claim 5, wherein the openings comprise grooves, and connecting holes extending from bottom surfaces of the grooves to the lower interconnections, the upper interconnections comprise upper layer conductive patterns embedded in the grooves, and connecting plugs electrically connecting the upper layer conductive patterns and the lower interconnections, and the third porous insulating portions are provided in contact with side surfaces of the upper interconnections, the second nonporous insulating portions are provided in contact with the third porous insulating portions, and fourth nonporous insulating portions are in contact with bottom surfaces of the upper layer conductive patterns and are provided in the second insulating film.

8. A semiconductor device according to claim 5, wherein the conductive patterns are composed of an electroconductive material, including Cu.

9. A semiconductor device according to claim 5, wherein the porous insulating portions are composed respectively of the first and second insulating films that have been perforated at about 70% of an entire area thereof.

10. A semiconductor device according to claim 5, wherein the first and second insulating films have an additive substance added thereto.

* * * * *